US012615855B1

(12) United States Patent | (10) Patent No.: US 12,615,855 B1
Fountaine et al. | (45) Date of Patent: Apr. 28, 2026

(54) NEAR-OMNIDIRECTIONAL INP NANOWIRE-HBT PHOTODETECTORS

(71) Applicant: NORTHROP GRUMMAN SYSTEMS CORPORATION, Falls Church, VA (US)

(72) Inventors: Katherine T. Fountaine, Los Angeles, CA (US); Philip W. C. Hon, Hawthorne, CA (US); Augusto L. Gutierrez-Aitken, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 589 days.

(21) Appl. No.: 18/162,123

(22) Filed: Jan. 31, 2023

(51) Int. Cl.
*H10F 30/24* (2025.01)
*H10D 10/01* (2025.01)
(Continued)

(52) U.S. Cl.
CPC ......... *H10F 30/245* (2025.01); *H10D 10/021* (2025.01); *H10D 62/119* (2025.01);
(Continued)

(58) Field of Classification Search
CPC ...... H10F 30/245; H10F 30/28; H10F 30/282; H10F 30/2823; H10F 39/021;
(Continued)

(56) References Cited

U.S. PATENT DOCUMENTS 4,740,823 A * 4/1988 Thompson .............. H10F 30/10
257/E27.128
6,005,266 A * 12/1999 Forrest .................. H10F 39/184
257/256
(Continued)

FOREIGN PATENT DOCUMENTS

CN 105226129 B * 2/2017 ............. H10F 77/14

OTHER PUBLICATIONS

Xie et al., A SiGe/Si heterojunction phototransistor detector, 2017, machine translation of CN 105226129, pp. 1-5. (Year: 2017).*
(Continued)

*Primary Examiner* — Natalia A Gondarenko
(74) *Attorney, Agent, or Firm* — Shumaker, Loop & Kendrick LLP; John A. Miller

(57) ABSTRACT

A photodetector including a high electron mobility transistor (HEMT) device or an indium phosphide (InP)-based heterojunction bipolar transistor (HBT) device including a collector layer, a base layer formed on the collector layer and an emitter layer formed on the base layer. The photodetector also includes a nanowire array electrically coupled to the HEMT device or the base layer of the HBT device, and may include a first sub-array positioned on one side of the emitter layer and second sub-array positioned on an opposite side of the emitter layer. The nanowire array includes a plurality of spaced apart and conical-shaped InP nanowires encased in a transparent medium, and are operable to absorb light over a wavelength band of 400-925 nm and convert the light to an (Continued)

electrical signal that is received by the HEMT or HBT device.

20 Claims, 2 Drawing Sheets

(51) Int. Cl.

| | | |
|---|---|---|
| *H10D 62/10* | (2025.01) | |
| *H10D 62/13* | (2025.01) | |
| *H10D 62/17* | (2025.01) | |
| *H10D 84/01* | (2026.01) | |

(52) U.S. Cl.
CPC ......... *H10D 62/133* (2025.01); *H10D 62/177* (2025.01); *H10D 84/01* (2025.01)

(58) Field of Classification Search
CPC .. H10F 39/107; H10F 39/184; H10F 39/1843; H10F 39/191; H10F 39/193; H10F 39/1935; H10F 39/802; H10F 39/8033; H10F 39/8037; H10F 39/804; H10F 77/1437; H10D 10/021; H10D 10/051; H10D 10/056; H10D 10/40; H10D 10/80; H10D 10/821; H10D 62/119; H10D 62/133; H10D 62/177; H10D 30/471; H10D 30/4732; H10D 30/4755; H10D 30/501; H10D 30/503; H10D 30/015; H10D 30/43; H10D 30/47; H10D 64/205; H10D 64/23; H10D 64/231; H10D 64/251; H10D 64/252; H10D 64/281; H10D 64/311; H10D 64/62; H10D 84/01; H10D 84/0112; H10D 84/0114; H10D 84/121; H10D 84/60; H10D 62/85; H10D 62/82; H10D 62/824; H10D 62/122; B82Y 30/00; B82Y 40/00; H03F 1/301; H03F 1/302; H03F 2200/451; H03F 3/245
USPC ...................................................... 257/462, 9
See application file for complete search history.

(56) References Cited

U.S. PATENT DOCUMENTS

| | | | | |
|---|---|---|---|---|
| 10,935,702 | B2 * | 3/2021 | Sorbel ..................... | G02B 1/111 |
| 2007/0108435 | A1 * | 5/2007 | Harmon ........... | H01L 21/02546 |
| | | | | 257/E29.189 |
| 2009/0233124 | A1 * | 9/2009 | Berg ...................... | B82Y 10/00 |
| | | | | 427/126.3 |
| 2016/0204233 | A1 * | 7/2016 | Botula ................ | H01L 23/3731 |
| | | | | 438/353 |
| 2019/0145926 | A1 * | 5/2019 | Krishna ................ | H10F 77/124 |
| | | | | 257/253 |
| 2022/0102563 | A1 * | 3/2022 | Wang ..................... | G02B 6/136 |

OTHER PUBLICATIONS

V. Jain, M. Heurlin, M. Karimi, L. Hussain, M. Aghaeipour, A. Nowzari, A. Berg, G. Nylund, F. Capasso, "Bias-dependent spectral tuning in InP nanowire-based photodetectors," Nanotech. (2017).

S.L. Tan, X.Y. Zhao, K.X. Chen, K.B. Crozier, Yaping Dan "High performance silicon nanowire bipolar phototransistors," Applied Physics Letters (2016).

Fountaine et al., "Near-Unity Unselective Absorption in Sparse InP Nanowire Arrays," ACS Photon/cs (2016).

V. Jain, A. Nowzari, J. Wallentin, M.T. Borgstrom, M.E. Messing, D. Asoli, M. Graczyk, B. Witzigmann, F. Capasso, L. Samuelson, H. Pettersson, "Study of photocurrent generation in InP nanowire-based p(+)-i-n(+) photodetectors," Nano Research (2014).

* cited by examiner

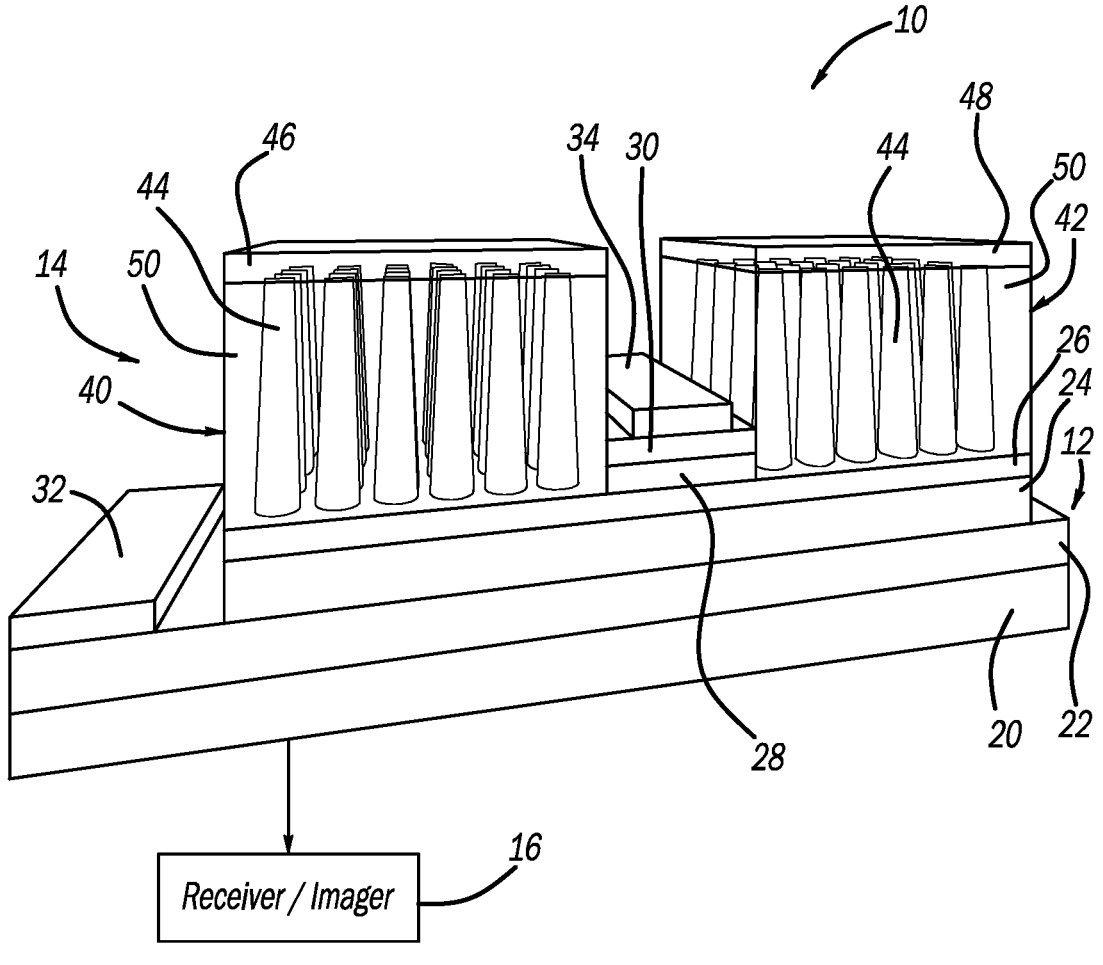
_FIG - 1_

NEAR-OMNIDIRECTIONAL INP NANOWIRE-HBT PHOTODETECTORS

BACKGROUND

Field

This disclosure relates generally to a detector including a semiconductor device and a nanowire array, where the array absorbs radiation and is electrically coupled to the semiconductor device and, more particularly, to a photodetector including an InP-based heterojunction bipolar transistor (HBT) device or a high electron mobility transistor (HEMT) device and an InP nanowire array, where the array absorbs light over a wide wavelength band and at a wide field-of-view (FOV), and is electrically coupled to a base layer of the HBT device or a channel layer of the HEMT.

Discussion

The absorption of electromagnetic radiation at certain wavelengths that is relatively broadband and is incident angle and polarization insensitive is desirable for many applications. For example, it may be desirable to provide a high absorption of a communications signal received by a receiver over a broad bandwidth and a broad angular range. However, planar layers of materials that could be used to absorb electromagnetic radiation reflect much of the energy incident on the surface of the material, where the reflection increases as the angle of incidence (AOI) of the radiation beam approaches the grazing angle for both S and P polarizations. This reflection characteristic of a material is primarily due to the Fresnel conditions that describe the behavior of light when moving between media having different indices of refraction, for example, from air to a waveguide. It is known that by making the surface interface of the material nano-structured, where the size of a unit cell of the structure is smaller than the incident beam wavelength, absorption of the beam can be improved. For example, by providing cylindrical nano-posts, enhanced absorption of radiation due to strong coupling into the first order azimuthal waveguide modes of the individual nanostructures may be realized.

Optical absorption elements are known in the art that include an array of semiconductor nano-pillars. These nano-pillars are capable of trapping and hence efficiently absorbing light. Studies have shown that semiconductor nano-pillar arrays are sensitive to incoming electromagnetic fields, which can affect the efficiency of the structure when absorbing energy, such as packing density and pillar height. Typically, graded type structures allow for grading of the index of refraction from one medium to another, which helps minimize reflections. Sparse semiconductor nano-pillar arrays also exhibit low reflectivity, thus negating the need for these graded index layers, and also act as the photoactive material, effectively absorbing light. The best semiconductor materials for absorption will typically be high index, direct bandgap semiconductor materials at wavelengths shorter than the material's bandgap and having high loss in the frequency band of interest. Suitable semiconductor materials may include direct bandgap materials, such as a-Si, III-V semiconductor materials, such as GaN, GaAs, InP, InSb, ternaries and quaternaries, etc., CdTe, CZTSSe, CIGS, perovskites, BiTe, etc., and indirect bandgap materials, such as c-Si, III-V semiconductor materials, such as GaP, and some ternaries and quaternaries, etc. Due to the need to integrate these nanowire arrays into an HBT or HEMT device structure, the most relevant material groups are III-V and SiGe compound semiconductors.

A heterojunction bipolar transistor (HBT) is a type of bipolar junction transistor (BJT) that uses different semiconductor materials for the emitter and base regions of the transistor so as to create a heterojunction. The HBT is able to operate using very high frequency signals, for example, up to several hundred GHz, and is commonly used in modern ultrafast circuits, usually radio-frequency (RF) systems, and in applications requiring high power efficiency, such as RF power amplifiers. The semiconductor materials employed in HBTs typically include a number of III-V compound semiconductors, such as GaN, GaAs and InSb, and SiGe compound semiconductors. HBTs that are fabricated based on indium phosphide (InP) technologies are often preferred for high-speed electronics, such as analog-to-digital (A/D) converters, digital-to-analog (D/A) converters, fiber optic amplifiers, voltage-controlled oscillators (VCOs), etc.

BRIEF DESCRIPTION OF THE DRAWINGS

FIG. 1 is an isometric view of a photodetector including an InP-based HBT device and an InP nanowire array that is part of a high-speed receiver or high resolution optical imager.

DETAILED DESCRIPTION OF THE EMBODIMENTS

Figure 2:
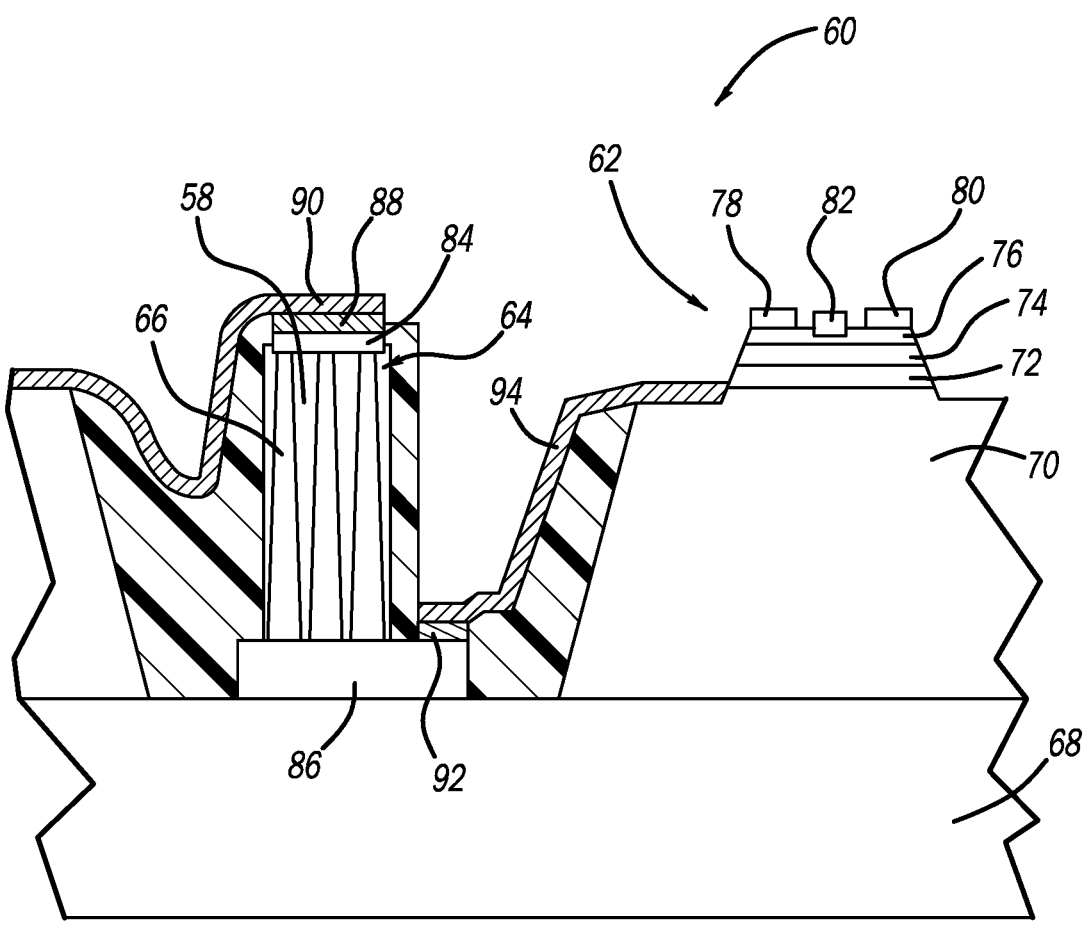
FIG. 2 is a profile view of a photodetector including an HEMT device and a nanowire array.

The following discussion of the embodiments of the disclosure directed to a photodetector including an InP-based HBT device or HEMT device and an InP nanowire array electrically coupled thereto is merely exemplary in nature and is in no way intended to limit the disclosure or its applications or uses. For example, the discussion herein refers to the photodetector as being part of a receiver or imager. However, as will be appreciated by those skilled in the art, the photodetector may have other applications.

In one embodiment, the present disclosure describes an InP nanowire array integrated onto an InP-based HBT device that has particular application in a wide FOV high speed receiver for optical communications purposes and in a high resolution photodetector for imaging in the visible to near-infrared wavelength bands.

FIG. 1 is an isometric view of a photodetector 10 including an HBT device 12 and a nanowire absorber array 14, where the photodetector 10 is part of a high speed receiver or a high resolution imager 16. For example, the photodetector 10 may be one pixel of the imager or may be a single photodetector for the receiver. The HBT device 12 includes a semiconductor substrate 20 on which is deposited a subcollector layer 22, a collector layer 24 deposited on the subcollector layer 22, a base layer 26 deposited on the collector layer 24, an N-type emitter layer 28 deposited on the base layer 26, and an emitter cap layer 30 deposited on the emitter layer 28. An ohmic contact 32 is formed on the subcollector layer 22 and an ohmic contact 34 is formed on the emitter cap layer 30. The HBT device 12 is intended to represent any HBT device suitable for the purposes described herein, and including any desirable configuration of semiconductor materials in any suitable configuration. In one non-limiting embodiment, the HBT device 12 incorporates InP semiconductor materials and employs InP fabrication technologies to provide the desired high-speed, high frequency and performance that those technologies can offer.

The nanowire array 14 includes a first nanowire sub-array 40 formed on the base layer 26 adjacent to one side of the emitter layer 28 and a second nanowire sub-array 42 formed on the base layer 26 adjacent to an opposite side of the emitter layer 28. It is noted that although the array 14 includes the two nanowire sub-arrays 40 and 42 in this non-limiting embodiment, other embodiments may include only a single nanowire array. The sub-arrays 40 and 42 include a number of conical-shaped and spaced-apart nanowires 44 that operate as absorbers to efficiently absorb electromagnetic radiation over a wide wavelength band as a result of tapered diameter of the nanowires 44, where the nanowires 44 are supported in a suitable optically transparent medium 50. In addition to the nanowire array 14 being highly efficient for absorbing radiation at the desired wavelength band, the nanowire array 14 is also highly efficient at absorbing radiation over a wide radiation incident angle, such as +/−60°. Therefore, the nanowire array 14 exhibits angle insensitive near-unity absorption over a broad spectral range as a result of strong and robust coupling into waveguide modes of the individual nanowires 44. The nanowire array 14 can be fabricated on the base layer 26 and in combination with the HBT device 12 by any suitable process, such as by a top-down etch fabrication process. In the embodiment where the HBT device 12 is an InP device, the nanowire array 14 is also an InP device and is fabricated in combination with the HBT device 12.

The selected length and the diameter of the nanowires 44, and the spacing between the nanowires 44, would depend on the desired wavelength band to be absorbed and the permittivity of the nanowire material. Generally, for a direct bandgap material, the length of the nanowires 44 would be about two times the center wavelength of the band divided by the real part of the material refractive index, and for a direct bandgap material, the length of the nanowires 44 would be about the center wavelength of the band divided by the real part of the material refractive index. In the non-limiting embodiment discussed above, the nanowires 44 are designed to absorb optical radiation in the visible to near-infrared wavelengths, specifically 400-925 nm. For this embodiment, the nanowires 44 could be 50 nm in diameter at their narrowest point, 200 nm in diameter at their largest point, and 1-3 μm in length.

An optically transparent contact 46, such as a transparent conducting oxide, for example, indium tin oxide, fluorine tin oxide, aluminum zinc oxide, etc., is formed on the sub-array 40 opposite to the base layer 26 and an optically transparent contact 48 is formed on the sub-array 42 opposite to the base layer 26. The contacts 46 and 48 are transparent to the electromagnetic radiation being absorbed by the nanowires 44 and allow the electrons that are emitted into the conduction band of the nanowire atoms as a result of the absorption of the radiation to be conducted into the base layer 26. Thus, the electron flow created by the absorption of the radiation is transferred into the base layer 26 and is amplified by the HBT device 12 in the known manner to be sent to the receiver/imager 16.

In this non-limiting embodiment, the sub-arrays 40 and 42 are rectangular-shaped. However, this is by way of a non-limiting example in that the sub-arrays 40 and 42 can be any shape suitable for the purposes described herein, for example, circular, square, etc., and do not need to be the same size. Further, although the array 14 is shown as covering the entire exposed surface of the base layer 26 for high efficiency purposes, this is also by way of example in that for other embodiments, the array 14 may only cover a portion of the exposed surface of the base layer 26.

Different semiconductor materials for the nanowires 44 can be employed for different absorption performance depending on the wavelength of the radiation being absorbed. For example, InP may be best for absorbing visible light, Si may be best for absorbing visible and near infrared (NIR) light, and InSb may be best for absorbing medium wavelength IR (MWIR) light. It is noted however that the material of the nanowires 44 determines the semiconductor material of the HBT device 12. Further, by making the nanowires 44 conical-shaped, where they do not have a constant diameter over their length the absorption characteristics of the array 14 is improved to be more broadband to absorb radiation over a wider bandwidth, and thus be more effective for certain absorption applications. It is stressed however that other shapes having other configurations, tapered or not, may be equally applicable, for example, circles, ellipses, any polygon shape, such as triangles, squares, rectangles, diamonds, quadrilateral, pentagon, hexagon, septagon, octagon, stars, etc., spirals, helices, wavy, etc. Further, multiple cross-sectional shapes can be incorporated into a single nano-pillar where the nano-pillar would transition to different shapes when moving along its length.

In an alternate embodiment, the HBT device 12 can be replaced with a field-effect transistor having the proper materials. FIG. 2 is a profile view of a photodetector 60 showing such an embodiment that includes an HEMT device 62 and a nanowire array 64 having an array of nanowires 66 encased in a protective material 58, where the HEMT device 62 and the array 64 are formed on, in this non-limiting embodiment, an InP:Fe substrate 68 during the same fabrication process. In this non-limiting embodiment, the HEMT device 62 includes an InAlAs buffer layer 70 formed on the substrate 68, an undoped InGaAs channel layer 72 formed on the buffer layer 70, a series of semiconductor layers 74, such as an undoped spacer layer, an Si planar doping layer and an InAlAs barrier layer, formed on the channel layer 72 and an InGaAs cap layer 76 formed on the semiconductor layers 74. A source terminal 78 and a drain terminal 80 are electrically coupled to the cap layer 76 and a gate terminal 82 is electrically coupled to the doping layer. A P+ InGaAs layer 84 is formed in electrical contact with the nanowires 66 at a top end of the array 64 and an N+ InP layer 86 is formed in electrical contact with the nanowires 66 at a bottom end of the array 64. The layer 84 is in electrical contact with a p contact layer 88 and a Ti/Au bridge 90 and is transparent to the electromagnetic radiation being absorbed. The layer 86 is in electrical contact with an N contact layer 92 and a Ti/Au bridge 94, where the bridge 94 is in electrical contact with the channel layer 72. The nanowires 66 absorb the radiation and cause electrons to be emitted into the conduction band of the nanowire atoms as a result of the absorption of the radiation to be conducted to the channel layer 72. Thus, the electron flow created by the absorption of the radiation is transferred into the channel layer 72 and is amplified by the HEMT device 62 in a known manner.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

5

6

What is claimed is:

1. A detector comprising:

a semiconductor device; and a nanowire array electrically coupled to the semiconductor device, said nanowire array including a plurality of spaced apart nanowires, said plurality of nanowires being operable to absorb radiation over a predetermined wavelength band and convert the radiation to an electrical signal that is received and amplified by the semiconductor device, wherein the semiconductor device is a heterojunction bipolar transistor (HBT) device including a collector layer, a base layer and an emitter layer, and wherein the nanowire array is separate from and formed directly on and in electrical contact with the base layer and laterally adjacent to the emitter layer.

2. The detector according to claim 1 wherein the nanowire array includes a first nanowire sub-array position on one side of the emitter layer and a second nanowire sub-array positioned on an opposite side of the emitter layer.

3. The detector according to claim 1 wherein the HBT device is an indium phosphide (InP) HBT device and the plurality of nanowires are InP nanowires.

4. The detector according to claim 1 wherein the nanowire array covers an entire exposed portion of the base layer.

5. The detector according to claim 1 wherein the detector is a photodetector and the nanowire array absorbs light.

6. The detector according to claim 5 wherein the nanowire array absorbs light in 400-925 nm wavelength band.

7. The detector according to claim 1 wherein each nanowire is conical-shaped.

8. The detector according to claim 1 wherein the nanowire array includes a contact that is transparent to the radiation and in electrical contact with the plurality of nanowires.

9. The detector according to claim 1 wherein a length and diameter of the plurality of nanowires is selected based on the wavelength band.

10. The detector according to claim 1 wherein a length of the plurality of nanowires is in a range of 1-3 µm and a diameter of the nanowires is in a range of 50 nm to 200 nm.

11. The detector according to claim 1 has a field-of-view of +/−60° with near unity absorption.

12. A photodetector comprising:

an indium phosphide (InP)-based heterojunction bipolar transistor (HBT) device including a collector layer, a base layer formed on the collector layer and an emitter layer formed on the base layer; and a nanowire array electrically coupled to the base layer, said nanowire array including a first sub-array positioned on one side of the emitter layer and second sub-array positioned on an opposite side of the emitter layer, each sub-array including a plurality of spaced apart and conical-shaped InP nanowires encased in a transparent medium, said plurality of nanowires being operable to absorb light over a wavelength band of 400-925 nm and convert the light to an electrical signal that is received by the base layer, wherein the nanowire array is separate from and formed directly on and in electrical contact with the base layer and laterally adjacent to the emitter layer.

13. The photodetector according to claim 12 wherein the first and second sub-arrays each include a contact that is transparent to light opposite to the base layer and in electrical contact with the plurality of nanowires.

14. The photodetector according to claim 12 wherein the nanowire array covers an entire exposed portion of the base layer.

15. The photodetector according to claim 12 wherein a length of the plurality of nanowires is in a range of 1-3 µm and a diameter of the nanowires is in a range of 50 nm to 200 nm.

16. The photodetector according to claim 12 has a field-of-view of +/−60° with near unity absorption.

17. The photodetector according to claim 12 wherein the photodetector is part of a receiver for optical communications.

18. The photodetector according to claim 12 wherein the photodetector is part of an imager.

19. A detector comprising:

a semiconductor device; and a nanowire array electrically coupled to the semiconductor device, said nanowire array including a plurality of spaced apart nanowires and an InP layer electrically coupled to the plurality of nanowires, said plurality of nanowires being operable to absorb radiation over a predetermined wavelength band and convert the radiation to an electrical signal that is received and amplified by the semiconductor device, wherein the semiconductor device is a high electron mobility transistor (HEMT) device including a channel layer, and wherein the nanowire array and the HEMT device are spaced apart on a common substrate and the InP layer is electrically coupled to the channel layer by a conductive bridge.

20. The detector according to claim 19 wherein the substrate is an InP:Fe substrate and the channel layer is an InGaAs channel layer.

* * * * *